(12) United States Patent
Yang et al.

(10) Patent No.: US 10,007,742 B2
(45) Date of Patent: Jun. 26, 2018

(54) PARTICLE FLOW SIMULATION SYSTEM AND METHOD

(71) Applicant: Institute of Modern Physics, Chinese Academy of Sciences, Gansu (CN)

(72) Inventors: Lei Yang, Gansu (CN); Ji Qi, Gansu (CN); Yuan Tian, Gansu (CN); Xiaofei Gao, Gansu (CN)

(73) Assignee: INSTITUTE OF MODERN PHYSICS, CHINESE ACADEMY OF SCIENCES, Gansu (CN)

( * ) Notice: Subject to any disclaimer, the term of this patent is extended or adjusted under 35 U.S.C. 154(b) by 728 days.

(21) Appl. No.: 14/415,377

(22) PCT Filed: May 22, 2013

(86) PCT No.: PCT/CN2013/076045
§ 371 (c)(1),
(2) Date: Jan. 16, 2015

(87) PCT Pub. No.: WO2014/094410
PCT Pub. Date: Jun. 26, 2014

(65) Prior Publication Data
US 2015/0213163 A1    Jul. 30, 2015

(30) Foreign Application Priority Data

Dec. 20, 2012   (CN) .......................... 2012 1 0558134

(51) Int. Cl.
*G06F 17/10*        (2006.01)
*G06F 17/50*        (2006.01)

(52) U.S. Cl.
CPC .......... *G06F 17/5009* (2013.01); *G06F 17/10* (2013.01); *G06T 2210/52* (2013.01); *G06T 2210/56* (2013.01)

(58) Field of Classification Search
CPC . G06F 17/10; G06F 17/5009; G06T 2210/52; G06T 2210/56
(Continued)

(56) References Cited

U.S. PATENT DOCUMENTS 7,952,583 B2 *  5/2011  Waechter ................ G06T 15/06
                                                     345/426
9,038,088 B2 *  5/2015  Phull ..................... G06F 9/5083
                                                     713/375
(Continued)

FOREIGN PATENT DOCUMENTS

CN         101727653 A      6/2010
JP         2009-66630 A     4/2009
(Continued)

OTHER PUBLICATIONS

Mussi, Luca, Fabio Daolio, and Stefano Cagnoni. "Evaluation of parallel particle swarm optimization algorithms within the CUDA™ architecture." Information Sciences 181, No. 20 (2011): 4642-4657.*
(Continued)

*Primary Examiner* — Aniss Chad
(74) *Attorney, Agent, or Firm* — Seed IP Law Group LLP

(57) ABSTRACT

The present invention provides a GPU-based particle flow simulation system and method which includes generating particle information based on particle modeling information inputted from a client terminal, and generating geometric solid information; receiving the particle information and the geometric solid information, determining which GPUs of which computation nodes are to be used based on the number of the particles and the number of idle GPUs in each of the computation nodes; determining which particles are to be processed in which GPUs of which computation nodes based on the determined number of GPUs and a space distribution of the particles, and performing allocation
(Continued)

according to the determination result; stimulating particle flow by computing in parallel in the plurality of GPUs a force applied to each particle due to particle collision and thus an acceleration; and presenting a stimulation result. The embodiments of the present invention can implement a virtual experimental simulation of high-density particles, and improve computation efficiency while reducing power consumption.

18 Claims, 4 Drawing Sheets

(58) Field of Classification Search
USPC .............................................................. 703/2
See application file for complete search history.

(56) References Cited

U.S. PATENT DOCUMENTS

| 9,760,376 B1* | 9/2017 | Bequet ................ G06F 9/30145 |
| 2011/0032255 A1 | 2/2011 | Favier et al. |
| 2012/0259602 A1 | 10/2012 | Nishiura et al. |

FOREIGN PATENT DOCUMENTS

| JP | 2009-69930 A | 4/2009 |
| JP | 2010-238030 A | 10/2010 |
| WO | 2012/034176 A1 | 3/2012 |

OTHER PUBLICATIONS

Gao, Xiaopeng, Zhiqiang Wang, Han Wan, and Xiang Long. "Accelerate Smoothed Particle Hydrodynamics Using GPU." In Information Computing and Telecommunications (YC-ICT), 2010 IEEE Youth Conference on, pp. 399-402. IEEE, 2010.*

Qiang-qiang, Huang, Jiang Shun-liang, Xu Shao-ping, and Dong Tian-wen. "The Simulation and Implementation of Discrete Particle System based on CUDA." In Business Computing and Global Informatization (BCGIN), 2011 International Conference on, pp. 501-504. IEEE, 2011.*

Su, C-C., Matthew R. Smith, F-A. Kuo, J-S. Wu, C-W. Hsieh, and K-C. Tseng. "Large-scale simulations on multiple Graphics Processing Units (GPUs) for the direct simulation Monte Carlo method." Journal of Computational Physics 231, No. 23 (2012): 7932-7958.*

Chen, Long, Oreste Villa, Sriram Krishnamoorthy, and Guang R. Gao. "Dynamic load balancing on single-and multi-GPU systems." In Parallel & Distributed Processing (IPDPS), 2010 IEEE International Symposium on, pp. 1-12. IEEE, 2010.*

International Search Report, dated Sep. 26, 2013, for International Application No. PCT/CN2013/076045, 4 pages. (with English Translation).

Written Opinion, dated Sep. 26, 2013, for International Application No. PCT/CN2013/076045, 5 pages.

Written Opinion, dated Sep. 26, 2013, for International Application No. PCT/CN2013/076045, 4 pages. (English Translation).

Harada et al., "Parallelizing Particle-based Simulation on Multiple GPUs," *Transactions of Information Processing Society of Japan* 49(12):4067-4079, Dec. 2008, with English Abstract.

Japanese Office Action dated Feb. 5, 2016, for corresponding Japanese Application No. 2015-521951, with English Translation, 6 pages.

Shirahata et al., "Improving MapReduce Task Scheduling for CPU-GPU Heterogeneous Environments," *IPSJ SIG Technical Report 2010-HPC-126*(5), Aug. 2010, with English Abstract, 8 pages.

Tsuzuki et al., "Dynamic load balance and strong scaling of Multi-GPU computation for passive scalar particles," *IPSJ SIG Technical Report 2012-HPC-133*(37), Mar. 2012, with English Abstract, 10 pages.

Chinese Office Action dated Jul. 28, 2015 for corresponding CN Application No. 201310195595.6, 11 pages (with English Translation).

Jiang et al., "Simulation and Implementation of Discrete Particle System based on CUDA," *Journal of Nanchang University (Engineering & Technology)* 33(3):290-294, Sep. 2011.

Moysey et al., "Modelling the solids inflow and solids conveying of single-screw extruders using the discrete element method," *Powder Technology* 153:95-107, 2005.

Xi et al., "An Integrated Algorithm of Real-Time Fluid Simulation on GPU," *Journal of Computer-Aided Design & Computer Graphics* 22(3):396-405, Mar. 2010.

* cited by examiner

PARTICLE FLOW SIMULATION SYSTEM AND METHOD

TECHNICAL FIELD

The present invention relates to the field of particle flow simulation, and more particularly, to GPU-based particle flow simulation system and method that are applicable in studies of particle or solid substance structures.

BACKGROUND

Particle systems have been studied all the time, and have been widely used in various industrial fields such as food control, chemistry, civil engineering, oil and gas, mining, pharmaceutics, powder metallurgy, and energy. In the aspect of theoretical research, issues like avalanche are studied by exploring how to achieve the densest accumulation, or in which condition a sand heap may collapse. To study relevant particle systems, people have to construct large-sized particle systems in experiments. This is time-consuming and laborious. Further, some particle systems cannot be constructed in experiments because they are very expensive or need to operate in some extreme conditions. These problems do not exist with stimulated systems based on virtual experiment.

Currently, DEM (Discrete Element Method) is a mainstream method among computation methods for stimulating particle systems. The DEM method is a numerical computation method for substance system analysis following the method of finite element, and computational fluid mechanics (CFD). The DEM method stimulates and analyzes particle behaviors by establishing a parametric model of an infinitesimal architecture, and provides a platform for addressing various issues relating to, for example, particle, structure, fluid, electromagnetic and coupling thereof. The DEM method has become a powerful tool for scientific process analysis, product design optimization and development. In addition to application in scientific research, the DEM method has now become mature in science and technology applications and industrial fields, and extended from scientific applications like particle substance research, soil and rock engineering, and geological engineering to design and development of industrial processes and products, leading to importance achievements in many fields.

The DEM method is characterized by high accuracy of simulation and large amount of computation. Currently, the DEM method is implemented mainly in CPU. However, due to inadequate computation power of CPU, computation scale is insufficient, and only small space and time dimensions can be computed in an acceptable length of time. Further, the construction cost is extremely high because it is necessary to construct a large-scale or super large-scale CPU cluster of computers. This will consume a huge amount of power, and incur extremely high cost of use and maintenance. Current DEM method implemented with CPU can be applied only in certain situations, such as a small number of particles or collision between low-density particle, and cannot be used in simulation of collision between large-number, high-density particles.

The technology of using GPU (Graphics Processing Unit) for general-purpose computations has become more sophisticated. GPUs by two graphics adapter manufactures, nVIDIA and AMD support general-purpose computations.

In view of the foregoing problems, the inventors of the present invention propose GPU-based particle flow simulation system and method.

SUMMARY

The present invention provides a GPU-based particle flow simulation system and method which can implement a virtual experimental simulation of high-density particles, and improve computation efficiency while reducing power consumption.

According to an aspect of the present invention, a GPU-based particle flow simulation method is provided which performs particle flow simulation by executing Discrete Element Method (DEM) in a plurality of parallel GPU. The method includes:

a. modeling the particles with the DEM method, assigning the DEM model as a plurality of particles, and allocating the plurality of particles to a plurality of computation nodes for processing, wherein CPU and GPU of each computation node are each allocated with memory space, data are initialized in the CPU and copied from the memory space of the CPU to the memory space of the GPU;

b. processing the particles in the GPU of each computation node, wherein each stream processor of the GPU of each computation node processes one particle and updates coordinates of the particle in the memory space of the GPU and particle velocity;

c. during the processing of step b, determining the particles controlled by each computation node, copying the number of the particles controlled by each computation node to the memory space of the CPU, dividing dynamically the particles according to the number of the particles in the memory space of the GPU, and determining dynamically which particles are to be processed by each computation node according to load balancing principle;

d. causing the dynamically-divided particles to migrate between the computation nodes with MPI (Message Passing Interface) protocol;

e. computing overlap areas in the GPU according to the particles to be processed by each computation node as determined in step c, copying data to the memory of the CPU, and performing data exchange with the MPI protocol;

f. computing, by each stream processor of the GPU of each computation node, a serial number of a grid in the memory space of the GPU in which each particle lies according to the coordinates of the particle;

g. computing, by each stream processor of the GPU of each computation node, a force applied to each particle and acceleration during the particle's movement;

h. computing, by each stream processor of the GPU of each computation node, a velocity of each particle;

i. returning to step b until a specified number of steps are performed;

j. releasing the memory spaces of the master node and the computation nodes.

In an embodiment, in steps b, f, g, and h, the GPUs perform parallel data processing on the particles, that is, the processing of the GPUs on the particles are parallel.

In an embodiment, the migration of the particles between the nodes in step d is performed using a method of particle migration between nodes, that is, migrating the particles between nodes by transmitting and receiving respective physical quantities of particles with MPI transmitting and receiving functions.

In embodiment, computing the overlap areas in the GPU in step e comprises using the GPU to compute the overlap areas, in which each stream processor of the GPU processes one grid. In the case of three dimensions, each grid has 26 neighboring grids. The step comprises determining whether a neighboring grid is within a current computation node, if it is not, considering the neighboring grid as an overlap area, and obtaining it through migration from another node.

According to another aspect of the present invention, a GPU-based particle flow simulation method is provided comprising:

a modeling step of determining particle material, particle parameter, boundary condition, geometrical shape, and initial particle distribution area, and generating particles according to predetermined particle distribution area and number;

a task managing step of determining an optimal number of GPUs according to the number of particles and a number of idle GPUs in a plurality of computation nodes, determining GPUs to be used based on the optimal number of GPUs and the number of current idle GPUs, and setting a state of the GPUs to be used to non-idle; and a computing step comprising
  initializing the GPUs to be used in each of the computation nodes, and transmitting to each GPU particle information required for computation;
  the respective GPUs updating predetermined velocities in parallel, and each GPU sorting the received particle information to generate its sorted cell list;
  the respective GPUs computing in parallel non-zero serial numbers of grids in their current processes and a number of particles in the grids, and transmitting the computed serial numbers of grids and the number of particles to a master node among the plurality of computation nodes; the master node dividing the grids dynamically based on the optimal number of particles for each GPU, and determining a number of grids and their serial numbers to be computed in parallel in each GPU;
  the respective GPUs transmitting and receiving particle information in parallel according to the determination result of the master node, and regenerating a respective sorted cell list in each GPU;
  generating a collision list at a current moment in each GPU;
  the respective GPUs adjusting in parallel locations for tangential relative displacement to conform to the collision list at the current moment, based on the collision list at the current moment, and a collision list and a tangential relative displacement at a previous moment;
  the respective GPUs computing in parallel a force applied to each particle and acceleration according to HM (Hertz-Mindlin) contact mechanics model;
  storing a current computation result;
  returning to the step of the respective GPUs updating predetermined velocities in parallel if computation is not completed, otherwise ending the computation.

In an embodiment, the method further comprises a presentation step of determining the boundary condition and drawing the geometrical boundary in the form of a transparent curved surface, drawing the particles as globules of identical or different colors according to particle location and diameter, displaying a scalar field in a grayscale image, and drawing a vector field with a streamline drawing method by weighted-mapping the particle information to the grids.

In an embodiment, the physical information of all the particles is saved into an external storage.

In an embodiment, the respective GPUs compute relevant physical statistical quantities in parallel.

In an embodiment, said generating particles according to predetermined particle distribution area and number comprises generating several particles in a small space, and filling these particles into other spaces by translating and duplicating until the number of the particles meets requirement.

In an embodiment, in the sorted cell list, all the particles are sorted according to the grids in which the particles lie.

In an embodiment, the GPUs computes in parallel non-zero serial numbers of grids and the number of particles in the grids by using a dynamic dividing method.

In an embodiment, in each GPU, the computation is performed in a manner of one thread corresponding to one particle.

In an embodiment, said computing the tangential relative displacement comprises recording the tangential relative displacement at a previous moment, and updating the tangential relative displacement based on the collision list at the current moment.

In an embodiment, the current computation result is stored in a data array through a copying or pointer exchanging technique.

According to a further aspect of the present invention, a GPU-based particle flow simulation system is provided comprising:

a modeling module configured to determine particle material, particle parameter, boundary condition, geometrical shape, and initial particle distribution area, and generate particles according to predetermined particle distribution area and number;

a task managing module configured to determine an optimal number of GPUs according to the number of particles and a number of idle GPUs in a plurality of computation nodes, determine GPUs to be used based on the optimal number of GPUs and the number of current idle GPUs, and set a state of the GPUs to be used to non-idle; and a computing module configured to
  initialize the GPUs to be used in each of the computation nodes, and transmit to each GPU particle information required for computation;
  update, by the respective GPUs, predetermined velocities in parallel, and sort the received particle information to generate its sorted cell list;
  compute in parallel, by the respective GPUs, non-zero serial numbers of grids in their current processes and a number of particles in the grids, and transmit the computed serial numbers of grids and the number of particles to a master node among the plurality of computation nodes; the master node dividing the grids dynamically based on the optimal number of particles for each GPU, and determining a number of grids and their serial numbers to be computed in parallel in each GPU;
  transmit and receive, by the respective GPUs, particle information in parallel according to the determination result of the master node, and regenerate a respective sorted cell list in each GPU;
  generate a collision list at a current moment in each GPU;
  adjust in parallel, by the respective GPUs, locations for tangential relative displacement to conform to the collision list at the current moment, based on the collision list at the current moment, and a collision list and a tangential relative displacement at a previous moment;

compute in parallel, by the respective GPUs, a force applied to each particle and acceleration according to HM (Hertz-Mindlin) contact mechanics model;

store a current computation result;

return to the step of the respective GPUs updating predetermined velocities in parallel if computation is not completed, otherwise end the computation.

In an embodiment, the system further comprises a presentation model configured to determine the boundary condition and draw the geometrical boundary in the form of a transparent curved surface, draw the particles as globules of identical or different colors according to particle location and diameter, display a scalar field in a grayscale image, and draw a vector field with a streamline drawing method by weighted-mapping the particle information to the grids.

According to a still further aspect of the present invention, a GPU-based particle flow simulation system is provided comprising:

a front-end server configured to generate particle information based on particle modeling information inputted from a client terminal, and generate geometric solid information;

a management node configured to receive the particle information and the geometric solid information from the front-end server, determine which GPUs of which computation nodes are to be used based on the number of the particles and the number of idle GPUs in each of the computation nodes, determine which particles are to be processed in which which GPUs of which computation nodes based on the determined number of GPUs and a space distribution of the particles, and perform allocation according to the determination result;

a plurality of computation nodes each including a plurality of GPUs and configured to stimulate particle flow by computing in parallel in the plurality of GPUs a force applied to each particle due to particle collision and thus an acceleration;

a back-end server configured to present a stimulation result.

In an embodiment, the front-end server is configured to generate the geometric solid information by decomposing the geometric solid into a finite number of curved surfaces and numbering these surfaces.

In an embodiment, the back-end server is configured to present the stimulation result by drawing the geometrical boundary in the form of a transparent curved surface, drawing the particles as globules of identical or different colors according to particle location and diameter, displaying a scalar field in a grayscale image, and drawing a vector field with a streamline drawing method by weighted-mapping the particle information to the grids.

In an embodiment, the front-end server, the management node, the computation nodes and the back-end server communicate with each other via an IB (InfiniBand) network.

With the present invention, a stimulation system from modeling to result presenting are achieved based on a plurality of GPUs, and a particle flow stimulation method based on multiple GPUs is also achieved in connection with the hardware characteristics of multiple GPUs. The embodiments of the present invention utilize the characteristics of GPU including powerful floating-point computation capability, high bandwidth and multiple lightweight computing cores, and a large number of stream processors in the GPU, and bring an acceleration algorithm of molecular dynamics into the DEM method to make the DEM method more suitable for the GPU hardware architecture. In the multiple GPU implementation, the dynamic data division method is used to achieve load balancing, thereby reducing overlap area and communication quantity, and improving utilization and operation efficiency of GPU and CPU. The present invention can achieve excellent computation in acceptable power consumption and time conditions, and improve computation efficiency with low power consumption and maintenance cost.

BRIEF DESCRIPTION OF THE DRAWINGS

The solutions of the present invention will be further described with reference to figures and embodiments. In the figures.

DETAILED DESCRIPTION OF THE EMBODIMENTS

Hereafter, the preferred embodiments of the present invention will be illustrated with reference to figures. It should be appreciated that the preferred embodiments described here are intended for illustration and explanation instead of limiting the present invention.

Figure 1:
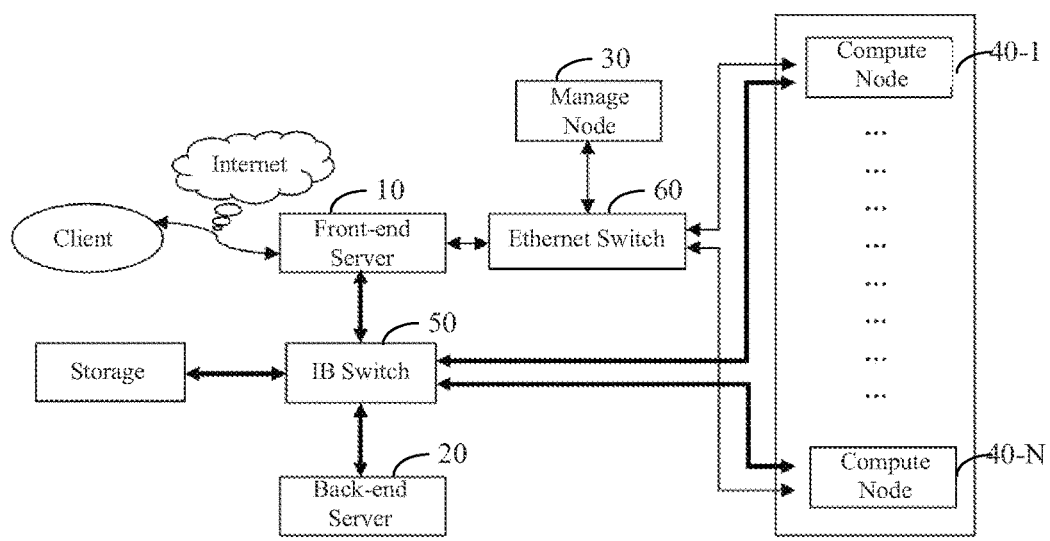
FIG. 1 is a schematic block diagram of a GPU-based particle flow simulation system according to an embodiment of the present invention.

FIG. 1 is a schematic block diagram of a GPU-based particle flow simulation system according to an embodiment of the present invention. As shown in FIG. 1, the system includes a front-end server 10, a back-end server 20, a management node 30, a plurality of computation nodes 40-1, ..., 40-N(N is an integer greater than 1), an IB switch 50, and an Ethernet switch 60. FIG. 1 also shows that the system includes a client terminal and a storage device. The client terminal may communicate with the front-end server 10 via Internet, such that experiment personnel in field can carry out experiments of particle flow simulation from a remote location. For example, a user may input at the client terminal information or parameters required for particle modeling, such as information about the number, size, and material of the particles (Young's modulus, Poisson ratio, density, coefficient of restitution and the like), and parameters including distribution range, friction coefficient, boundary condition of the particles, and give material information of geometric solid in contact with the particles. The user may transmit the information or parameters to the front-end server. The external storage device may store computation results of the respective computation nodes, for example, to prevent data loss due to unexpected events like computer shutdown or power off Here, the client terminal and the external storage device are optional. The user may input data directly on the front-end server, or the computation results of the computation nodes may be stored in the front-end or back-end server.

In FIG. 1, the front-end server 10, the back-end server 20, and the computation nodes 40 are connected via the IB switch 50, and the front-end server 10, the management node 30, and the computation nodes 40 are connected via the Ethernet switch 60. However, any other suitable connection may be used in embodiments of the present invention. In an embodiment, the computation nodes 40 may be a high performance cluster having GPU acceleration cards. In an embodiment, each computation node may have a NVIDIA general-purpose computation card above GF110 core. In an embodiment, the computation nodes are connected via an IB (InfiniBand) network of 40 Gb. In an embodiment, each of the front-end and back-end servers is a graphics workstation having a Quadrio 6000 graphics adapter. For example, the workstation has a memory larger than 32G, and an IB network adapter.

In the GPU-based particle flow stimulation system according to the embodiment of the present invention, the front-end server 10 generates particle information based on the particle modeling information inputted from the client terminal, and generates geometric solid information. The front-end server 10 may receive, for example, input of information about particle size, material and geometric configuration, and add or delete particles or shift particle locations in an interactive manner. The front-end server 10 may generate geometric solid information by decomposing the geometric solid into a finite number of curved surfaces and numbering the surfaces. The management node 30 may check operation state, GPU operation state and storage of the respective computation nodes, and abort a submitted task to ensure that no conflict occurs between the tasks. For example, the management node 30 may receive the particle information and the geometric solid information from the front-end server 10, determine which GPUs of which computation nodes are to be used based on the number of the particles and the number of idle GPUs in each of the computation nodes, determine which particles are to be processed in which which GPUs of which computation nodes based on the determined number of GPUs and a space distribution of the particles, and perform allocation according to the determination result. The computation nodes 40 together form a computation module which can process complex boundary issues, operate multiple GPU in parallel, have interrupt function (e.g., power off), and continue computation from a state before the interrupt. The computation module may guarantee dynamic balancing of data using dynamic data division and pointer exchange techniques. For example, each of the computation nodes 40 stimulates particle flow by computing in parallel in its multiple GPUs a force applied to each particle due to particle collision and thus acceleration. The back-end server 20 may present simulation results, for example, dynamically presenting current parameters of particles, like configuration, temperature field, flow field and pressure strength field. It is also possible to interactively adjust viewing angle or scale the groups of particles. The back-end server 20 may include an output device like a display. The back-end server 20 may draw the geometrical boundary in the form of a transparent curved surface, draw the particles as globules of identical or different colors according to particle location and diameter, display a scalar field like temperature field in a grayscale image, and drawing a vector field like flow field or pressure strength field with a streamline drawing method by weighted-mapping the particle information to the grids.

The above system is merely one of possible implementations of the present inventive concept. Those skilled in the art can understand that the functions of the respective components may be reallocated or combined to form some other system architecture. Further, the functions of the above components may be integrated in a single computer or workstation if it is sufficiently powerful.

Figure 2:
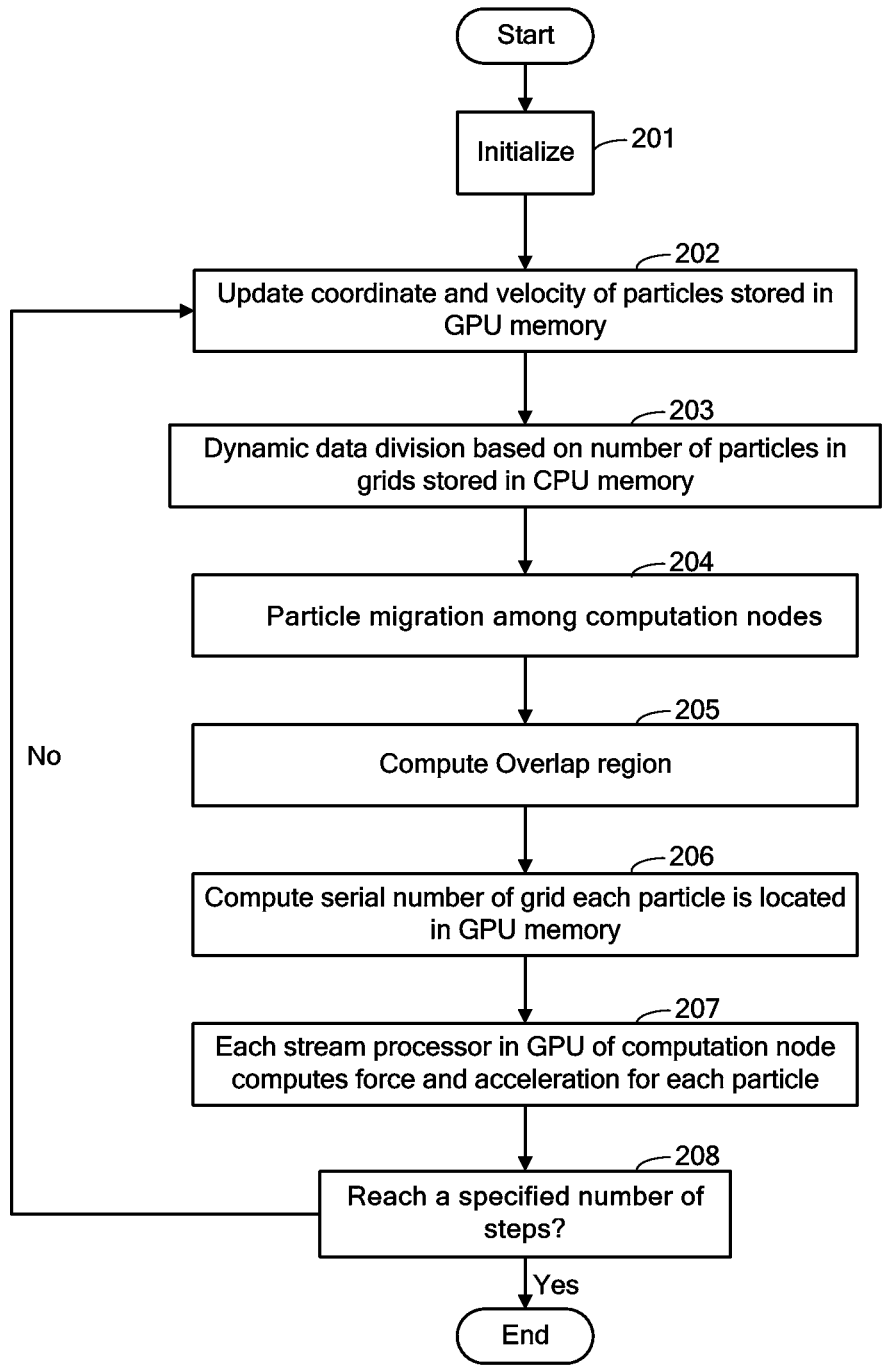
FIG. 2 is a flowchart of a GPU-based particle flow simulation method according to an embodiment of the present invention.

FIG. 2 is a flowchart of a GPU-based particle flow simulation method performed in the simulation system according to an embodiment of the present invention. As shown in FIG. 2, the simulation method includes the following steps.

201. Modeling the particles with the DEM method, assigning the DEM model as a plurality of particles, and allocating the plurality of particles to a plurality of computation nodes for processing, wherein CPU and GPU of each computation node are each allocated with memory space, data are initialized in the CPU and copied from the memory space of the CPU to the memory space of the GPU.

202. Processing the particles in the GPU of each computation node, wherein each stream processor of the GPU of each computation node processes one particle and updates coordinates of the particle in the memory space of the GPU and particle velocity.

203. The coordinates of the particles stored in the memory space of the GPU will change. To guarantee load balancing, particles in each computation node will be changed for each time of computation. The GPU of each computation node may first compute the particles controlled by the computation node, copy the number of the particles controlled by each GPU to the memory space of the CPU, divide dynamically the particles according to the number of the particles in the memory space of the GPU, that is, determining dynamically which particles are to be processed by each computation node according to load balancing principle.

204. Causing the dynamically-divided particles to migrate between the computation nodes with the MPI protocol.

205. Computing overlap areas in the GPU according to the particles controlled by each computation node as determined in step 203, copying data to the memory of the CPU, and performing data exchange with the MPI protocol.

206. Computing, by each stream processor of the GPU of each computation node, a serial number of a grid in the memory space of the GPU in which each particle lies according to the coordinates of the particle.

207. Computing, by each stream processor of the GPU of each computation node, a force applied to each particle and acceleration during the particle's movement.

208. Computing, by each stream processor of the GPU of each computation node, a velocity of each particle.

209. Returning to step 202 until a specified number of steps are performed to complete the DEM method.

210. Releasing the memory spaces of the master node and the computation nodes.

In steps 202, 206, 207, and 208, the GPUs perform parallel data processing on the particles, that is, the processing of the GPUs on the particles are parallel.

The migration of the particles between the nodes in step 204 is performed using a method of particle migration between nodes, that is, migrating the particles between nodes by transmitting and receiving respective physical quantities of particles with MPI transmitting and receiving functions which may be MPI_Send( ) and MPI_Recv( ).

Computing the overlap areas in the GPU in step 205 includes using the GPU to compute the overlap areas, in which each stream processor of the GPU processes one grid. In the case of three dimensions, each grid has 26 neighboring grids. The step comprises determining whether a neighboring grid is within a current computation node, if it is not, considering the neighboring grid as an overlap area, and obtaining it through migration from another node.

Hereafter, the above method will be described in detail.

Step 1, each computation node allocates a memory space in each of CPU and GPU, initializes data in CPU and copies the data to GPU.

Step 2, each of stream processors in GPU of each computation node processes one particle, and these stream processors update in parallel the particle coordinates by one step size and the particle velocities by half an step size. The Kernel functions of CUDA are included:

```
_global_ void UpdateP(double *x1, double *x2, double *x3,
                      double *vx, double *vy, double *vz,
                      double *ax, double *ay, double *az,
                      unsigned int NumParticles);
_global_ void UpdateV (double *vx, double *vy, double *vz,
                       double *wx, double *wy, double *wz,
                       double *ax, double *ay, double *az,
                       double *bx, double *by, double *bz,
                       unsigned int NumParticles);
```

The functions may be invoked according to grammar requirements of CUDA as follows:

```
UpdateV <<<gridsize, blocksize>>>(vx, vy, vz,
                                  wx, wy, wz,
                                  ax, ay, az,
                                  bx, by, bz,
                                  NumParticles);
```

Blocks and grids of the two functions are of one dimensional form. The values of the blocks and grids may be adjusted with respect to different numbers of particles. This may influence the time required for computing.

Step 3, GPU of each computation node computes the particles controlled by the node, and copies the particles to CPU for dynamic division according to the numbers of particles in the grids.

The particles will migrate between different nodes during the computation procedure. To avoid load unbalancing, dynamic data division is used in the present invention to balance amount of computation for each node.

It is assumed that in an initial state, there are M grids each having a number X of particles. The M grids ($G_0$~$G_{M-1}$) are divided equally into N segments which are allocated respectively to N nodes ($P_0$~$P_{N-1}$) for processing. In this case, each node will compute a number (M/N)*X of particles. The total number of particles in the range of grids computed by each node Pi will change after iterations of computation. The total number of particles may be changed by adjusting the range of grids computed by each node. The dynamic data division may be implemented as follows.

(1) Each node maintains an int-type data array iCellCount identical to a global number of grids, M. CUDA kernel function calcParticleNumPerCel( )1 calculates the number of particles in each grid, and saves the number in iCellCount. The number of particles in iCellCount is local, and records only the numbers for those grids on which the current node operates.

(2) Let the node PID=0 be the node ROOT. The MPI reduce function MPI_Reduce( ) is called to collect, through an addition operation, information in iCellcount for all the nodes into the data array iGlobalCellcount under the node ROOT. The numbers of particles in the respective grids recorded in the data array iGobalCellCount are global, that is, the numbers of particles in all the grids.

(3) The iGlobalCellCount is used to divide the grids with respect to the respective node. The division is performed in a CPU+GPU manner, and includes the following steps:

Dividing the data array iGlobalCellCount equally into N segments according to the number N of the nodes, and assuming that the range of grids calculated by each node is the same; saving the range of grids calculated by each node in a data array iDivideResult; the values of elements in the iDivideResult in the initial state are $$\left\{0, \frac{M}{N}-1, \frac{M}{N}, \frac{2M}{N}-1, \ldots, \frac{(N-1)M}{N}, M-1\right\};$$

the range for the node i may be obtained from iDividedResult[i*2] and iDividedResult[i*2+1];

Invoking CUDA kernel function dReducePerSeg( ) to obtain the number of particles in each segment, and saving the number in a data array iParticlesCountPerSeg={$X_0$, $X_1$, ..., $X_{N-1}$}.

Determining, by the CPU, the final division result from iDividedResult, iParticlesCountPerSeg and iGlobalCellCount. First, the number iParticlesPerNodeIdeal of particles in an ideal situation is given, and the value of iParticlesCountPerSeg [0] is read. If iParticlesCountPerSeg[0]>iParticlesPerNodeIdeal, it indicates that the range to be processed by the node 0 is too large, then:

iParticlesCountPerSeg[0]−iGlobalCellCount[iDividedResult[0*2+1]],
iParticlesCountPerSeg[1]+iGlobalCellCount[iDividedResult[0*2+1]],
iDividedResult[1*2]=iDividedResult[0*2+1],
iDividedResult[0*2+1]−1, the above process is repeated until iParticlesCountPerSeg [0] is equal or close to iParticlesPerNodeIdeal; if iParticlesCountPerSeg[0]<iParticlesPerNodeIdeal, it indicates that the range to be processed by the node 0 is too small, and then a process opposite to the above process is performed; when iParticlesCountPerSeg[0] is equal or close to iParticlesPerNodeIdeal, the range to be processed by the node 0 is iDividedResult[0], iDividedResult[0*2+1];

the process in (3) is performed for all the segments, and the range of grids to be processed by each node is obtained.

(4) the node ROOT calls the function MPI_BCast( ) to broadcast the division result to all the nodes.

Step 4, MPI interface protocol is used to cause the particles migrate among the nodes after the data division.

Each of the nodes determines data arrays iSendGridInfo and iSendParticlesOffset according to the division result iDividedResult. The sizes of the data arrays iSendGridInfo and iSendParticlesOffset are the same as the number of the global grids. iSendGridInfo records each of the grids is located in which of the nodes, and iSendParticlesOffset records the position of the first particle in the particle data array for each grid.

It is determined from the length of the chain table gridInfo that the current node will send particles to a number iSendNodeCount of nodes, and the information about the sending is written into the data array iSendInfo. The length of iSendInfor is iSendNodeCount*3. iSendInfo[i*3] is the serial number PIDR of the nodes to receive particles, iSendInfo[i*3+1] is the number of particles to be sent, and iSendInfo[i*3+2] is the serial number PIDS of the nodes to send particles.

The node ROOT calls the function MPI_Gatherv( ) to collect the data arrays iSendInfo of all the nodes into the data array iGlobalSendInfo, and sorts them in an ascending order of the value of iGlobalSendInfo[i*3]. Then, the node ROOT calls the function MPI_Scatterv( ) to send triplets to corresponding nodes based on the value of iGlobalSendInfo[i*3].

The respective nodes receive and save the triplets sent by ROOT in the data array iRecvInfo, and begin transmitting and receiving particles.

Step 5, the Overlap area is computed in GPU based on the particles controlled by each node as obtained in step 3; the data are copied to the memory of CPU, and then data exchange is performed according to the MPI interface protocol.

During computation for each grid in the 3-dimensional DEM, data of particles in the 26 neighboring grids (i.e., overlap grids) are needed. Therefore, after the division of grid range for each node and the transmission of particles, each node must obtain its overlap grids in order to an accurate computation. The overlap exchange process is implemented as follows:

saving the received particles in the particle data array while removing the transmitted particles from the particle data array; sorting the updated particle data array in an ascending order of the serial number of corresponding grid, and re-computing the data arrays iCellCount and iSendParticlesOffset;

based on the grid range to be processed by the current node as recorded in the data array iDividedResult, computing neighboring grids for a grid in each range, and determining the serial numbers of the neighboring grids which are not in the current node and the serial number of the nodes these neighboring grids reside;

calling, by the node ROOT, the function MPI_Gatherv to gather the data array iSendInfo to the data array iGlobalSendInfo under the node ROOT; after sorting them in an ascending order of iGlobalSendInfo[i*3], calling the function MPI_Scatterv to send the triplets to corresponding nodes based on the value of iGlobalSendInfo[i*3];

the respective nodes save the triplets sent by ROOT in the data array iRecvInfo; determining how many particles to be sent to the node of the serial number iRecvInfo[i*3+2] based on iCellCount[iRecvInfo[i*3+1]], while let iSendGridInfo[iRecvInfo[i*3+1]]=iRecvInfo[i*3+2];

sending the particles in the overlap grids to the specified nodes using the method of step 2.

Step 6, each of the stream processors in the GPU of each computation node processes one particle, and computes the serial number of the grid where the particle is located based on the coordinates of the particle.

To preserve the memory space, the serial numbers of grids are stored in a line of one-dimension, and the CUDA kernel function is called to obtain the serial number of grid ParticleHash where the particle is located.

calcHash<<<gridsize, blocksize>>> (ParticleHash, ParticleIndex,
    x1, x2, x3,
    NumParticles);

When a grid where a particle outside the computing area is determined, the particle may be artificially placed into some grid inside the computing area, without influence on the computation.

Then, cell-list is generated based on ParticleHash using the following kernel function:

CalcCellStartEnd<<<gridsize, blocksize>>> (cellStart, cellEtart,
    ParticleHash, ParticleIndex,
    NumParticles)

The kernel function is called based on the above result to generate a neighboring list NbrLst for each particle:

nbrlstgen<<<gridsize, blocksize>>>(NbrLst, NbrLstcnt,
    x1, x2, x3,
    ParticleIndex, ParticleHash,
    CellStart, CellEnd, NumParticles);

A new tangential relative displacement U is calculated based on the generated NbrLst.

Step 7, each of the stream processors in the GPU of each computation node processes one particle, and computes an applied force and acceleration.

According to the requirements of the DEM method, the applied force and acceleration for each particle is calculated based on NbrLst and U obtained in step 6 combined with the coordinates, velocity and angular velocity of the particle. The acceleration and angular acceleration of each particle is calculated according to Newton second law.

Step 8, the velocity of the particle is updated half-size based on the acceleration and angular acceleration calculated in step 7. The calculation method is the same as that in step 2.

Step 9, the flow loops back to step 2 to continue the calculation until the requirement is satisfied.

Step 10, the desired data are copied from the memory of GPU to the memory of CPU, and the memory space of the master node and computation nodes are released.

The following table shows the execution result of the above simulation method. The program runs on nVIDIA GPUs for different steps with different numbers of blocks and threads.

| Number of Particles | GPU Core | precision | Number of CPUs | Number of blocks | Number of Threads | Iteration Steps | Execution Time |
|---|---|---|---|---|---|---|---|
| 20000 | GTX580 | double | 1 | 157 | 128 | 1 million | 0.8 hour |
| 20000 | GTX580 | double | 1 | 313 | 64 | 1 million | 1.35 hours |
| 400000 | Tesla C1060 | single | 1 | 3125 | 128 | 10 million | 14.6 hours |
| 100000 | GTX580 | double | 8 | 98 | 128 | 1 million | 0.7 hour |

Figure 3:
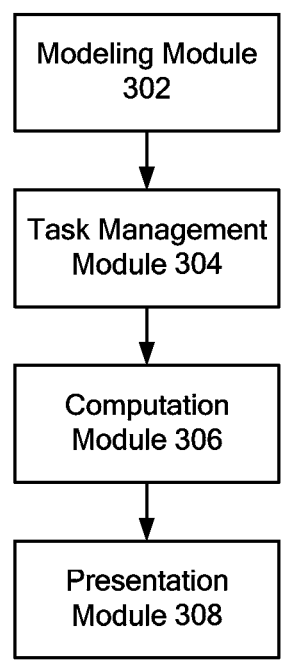
FIG. 3 is a schematic diagram of modules in a GPU-based particle flow simulation system according to another embodiment of the present invention.

FIG. 3 is a schematic block diagram of a GPU-based particle flow simulation system according to another embodiment of the present invention. As shown in FIG. 3, the modularized simulation system includes a modeling module 302, a task management module 304, a computation module 306, and a presentation module 308. In connection with FIG. 1, the modeling module 302 may be implemented in the front-end server 10, the task management module 304 may be implemented in the management node 30, the computation module 306 may be implemented as a cluster of the computation nodes 40, and the presentation module 308 may be implemented in the back-end server 20. However, these modules may be implemented in, for example, one or more computers in any appropriate manner.

The modeling module 302 receives information for particle generation, such as information about the number, size, and material of the particles (Young's modulus, Poisson ratio, density, coefficient of restitution), and parameters like the distribution range, friction coefficient, and boundary condition, and gives material information of geometric solids to contact with the particles.

The modeling module 302 generates desired particle models (also simply referred to as particles) based on the received information. To ensure that there is no or little overlap between the generated particles, the particle models may be generated in the following methods: (1) a regular generation method in which regular particles are generated in regular ranges, but it is necessary to add variations of 0.1~1% of the particle radius; (2) a method in which each newly generated particle is compared with all the preceding particles to determine whether there is any overlap, the particle is regenerated if there is overlap, and the generation is successful if there is no overlap; (3) a method in which several particles are first generated in a small space using the method (2), and then these particles are translated and replicated to other spaces until the number of particles meets the requirement. This improves the randomness of the particle distribution, and reduces the time required for computation. In addition to the three methods, in the case of a small number of particles, an interactive method may be used after determining the space range, and the particles are generated by clicking with a mouse.

After generating the particles, the modeling module 302 processes information of geometric solid. It decomposes the geometric solid into a finite number of curved surfaces, and numbers these curved surfaces. Then, the generated particles, geometric solid and other material information are provided to the task management module 304.

The task management module 304 first allocate nodes and GPUs to the current tasks according to the transmitted number of particles and the number of idle GPUs, and if there is no sufficient resource, notifies the user or let the user select to wait or abandon. After determining the GPUs, the module 304 stores the initial location information of particles in the GPU of the management node 30, and determine which particles to be processed by which GPUs of which computation nodes 40 based on the number of GPUs and the spatial distribution of the particles. The task management module 304 transfers the result of determination to the computation module 306 to allocate the particles to the respective computation nodes 40.

After obtaining the desired particles, each computation node 40 accumulates the current acceleration by ½ step to obtain a velocity after the ½ step, and updates the locations of all the particles based on the velocity and current coordinate values of the particles.

Collision detection is performed after the location updating. At this time, the space is divided into several grids. When calculating a force applied to any of the particles, it is calculated whether the particle collides with the particles in the neighboring grids. If a collision happens, the colliding particle is put into a collision list, and the number of colliding particles is incremented by one.

When calculating the force applied to a particle, the information of coordinates, velocity and angular velocity of its colliding particles is first extracted to calculate the force, and then a total force for all the colliding particles are obtain, and the acceleration of the particle is calculated. When calculating the force applied to a particle by a surrounding geometric solid, the distance between the particle and the geometric solid is first calculated. If the distance is less then the radius of the particle, it is considered that the particle collides with the geometric solid. Assuming the geometric solid as a particle having an infinite mass and zero velocity and angular velocity fields, the force applied to the particle by the geometric solid can be calculated as above explained.

In order to continue computing after an interrupt, data computed in one step may be stored per hour according to practical requirements. If necessary, the computation module 306 may further compute and store physical quantities such as close packing rate, average packing density, and temperature viscosity coefficient. The computed data may be sent to the presentation module 308 if the user wants to have a visualized presentation of the computation result.

The operation flow of the computation module 306 will be further described in connection with FIG. 4. In this embodiment, a "sorted cell list method" may be used in the computation process of the computation module 306. The method sorts all the particles according to the grids where the particles are located, and takes full advantages of the two data arrays CellStart and CellEnd. This method has the features of simple structure and easy implementation without compromising efficiency. Therefore, the method is suitable for collision of various particles of high density, and can solve the problem of particle transfer between nodes caused by high velocity of the particles.

The physical quantities describing the particles include coordinates pos, velocity vel, angular velocity w, acceleration a, angular acceleration beta, tangential relative displacement U. These variables are three-dimensional variables. The physical quantities may further include the serial number hash of a grid where the particles is located, a permanent global serial number pid and temporary local serial number index of a particle, a collision list CollideList of the particles, and the number CollideListCnt of the particles involved in a collision.

A cell refers to a grid obtained by the above-described division. Here, "cell" and "grid" have the same meaning and can be used interchangeably. Variables describing a cell i include cellStart[i], cellEnd[i], and cellCount[i], where i denotes a serial number of the cell, cellStart[i] denotes a serial number of a starting particle in the cell i, cellEnd[i] denotes a serial number of a ending particle in the cell i, and cellCount[i] denotes the total number of particles in the cell i.

A two-dimensional data array for describing a process communication may be called ParticlesSendToEachNode, and the element [i][j] at the ith row and the jth column denotes the total number of particles sent from the ith node to the jth node.

A temporal integration algorithm used in the present invention is the velocity verlet algorithm (an existing integration algorithm, see e.g., http://en.wikipedia.org/wiki/Verlet_integration).

Figure 4:
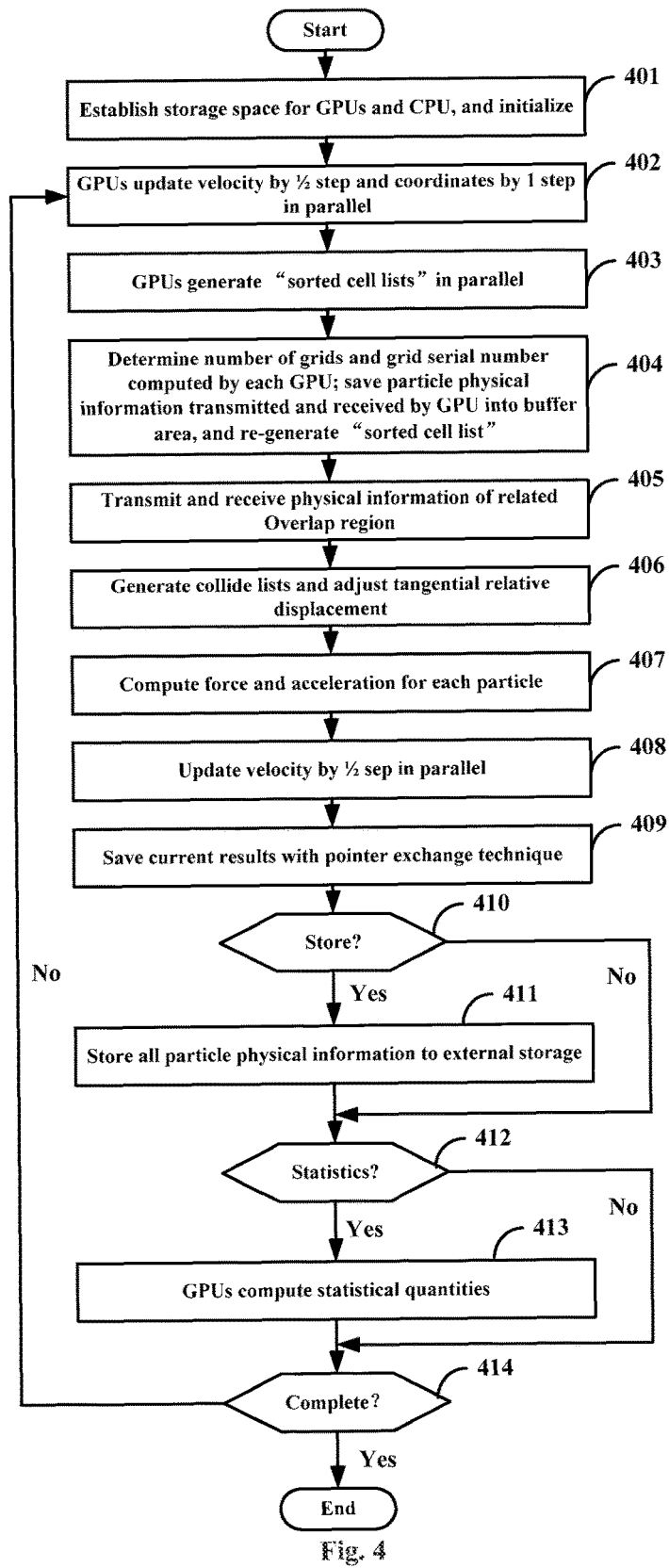
FIG. 4 is a flowchart of operations of a computation module according to an embodiment of the present invention.

As shown in FIG. 4, at step 401, initialization is performed including establishing storage spaces of GPU and CPU, and transmitting calculated information of particles to the GPUs in the respective computation nodes.

At step 402, the predetermined velocity and coordinates are updated. For example, the velocity (or angular velocity) is updated by ½ step according to an acceleration (or angular acceleration), and then the coordinates of the particle are updated according to the velocity, as shown in the following equations.

$$\vec{v}\left(t+\frac{\Delta t}{2}\right)=\vec{v(t)}+\vec{a(t)}\frac{\Delta t}{2}, \vec{r(t+\Delta t)}=\vec{r(t)}+\vec{v\left(t+\frac{\Delta t}{2}\right)}\Delta t$$

The above two steps are performed in parallel in the GPUs of the respective computation nodes. Each thread in the GPU corresponds to one particle. In this way, the highest efficiency of GPU can be achieved.

After the new coordinates are obtained, an acceleration (or angular acceleration) needs to be computed with the new coordinates and the new velocity (or angular velocity).

The coordinates of the particles have been changed, and it is thus possible that a particle initially computed in a process (or GPU) A should be computed in a process B. At this time, it is necessary to transmit all information of the particle from the process A to the process B.

First, the serial number Hash of a grid where each particle is located is calculated in the GPU of each computation node. The particles are sorted by taking, as key-value, the serial number Hash of the grid where each particle is located and the local serial number index of the particle. This step is implemented with the thrust library (an existing well-defined library which has been integrated into cuda, see e.g., http://code.google.com/p/thrust/). According to "Hash" after the sorting, step 403 is performed to calculate cellStart[i], cellEnd[i], and cellCount[i] of each grid i in the GPUs in parallel.

All of the physical quantities of the particles are sorted according to "index" after the sorting.

Now, all of the physical quantities of the particles are sorted according to the serial numbers of grids where the particles are located. The result together with cellStart[i], cellEnd[i], and cellCount[i] of each grid i is called "sorted cell list."

Then, at step 404, dynamic division is performed. Specifically, each of the computation node sends the serial number of the current grids of particles and the number of particles in the node to the master node among the plurality of computation nodes. That is, each computation node sends i and cellCount[i] to the master node if cellCount[i]!=0. The master node sums cellCount[i] sent from the respective computation nodes to obtain cellCount[i] of the overall space. The master node re-divides and reallocates the particles to be computed in each GPU based on the cellCount[i] of the overall space. The principle of dividing is that in unit of grid, each GPU computes continuous grids, and the total number of particles in the grids approximates the average number of particles for each GPU. In this way, each GPU obtains a particle computation scope due to variation in particle coordinates.

Information about the particles is transmitted and received according to new computation scope and current computation scope of each GPU. A two-dimensional data array, ParticlesSendToEachNode, is created to determine the number of particles to be transmitted and received by each GPU. Each dimension of the data array has a size corresponding to the number of processes (or the number of GPUs). ParticlesSendToEachNode[i][j] represents the number of particles to be transmitted from the ith GPU to the jth GPU, i.e., the number of particles to be received by the jth GPU from the ith GPU. The diagonal elements in the data array are all zero. The number of particles to be transmitted from the ith GPU can be obtained by summing up the elements in the ith row of the data array. The number of particles to be received by the jth GPU can be obtained by summing up the elements in the jth column of the data array. The data array ParticlesSendToEachNode may be computed by using cellStart and cellCount as inputs. Meanwhile, a data array SendStart may be computed, which is also a two-dimensional data array. SendStart[i][j] denotes a position of a particle in the data array which is the first one to be sent from the ith GPU to the jth GPU. Then, it is possible to retrieve information about the particles to be sent from GPU and send the information to a buffer area for particles to be transmitted. Next, the number of particles to be received by each GPU may be determined by summing up the elements in a respective column of the data array, and a corresponding buffer area may be established for preparation of reception. The physical information of the respective particles may be transmitted and received by using, for example, asynchronous transmitting and receiving mode MPI_Irecv and MPI_Isend functions in the MPI standard functions, until all the transmission and reception are completed.

The received data arrays are copied to the ends of the respective data arrays in the GPU by using the function cudaMemcpyHostToDevice (a known function for storing data to be exchanged with main memory in GPU). The buffer areas for transmission and reception are released.

So far, information required for calculating new particles in each GPU has been obtained. It is necessary to consider the newly arrived particles and the transmitted particles, and re-calculate the "sorted cell list" in order to obtain the sorted data arrays of physical quantities.

The particles calculated in each GPU are not independent of those in another GPU, that is, there are Overlap regions between GPUs. Therefore, at step 405, the Overlap region for each GPU may be calculated based on the serial numbers of girds calculated in the GPU. With a method similar to the dynamic division, each GPU may obtain physical information about particles in its Overlap region, and store the information to the end of each data array. In this way, although the data array added with the physical information about the Overlap region is not fully sorted, the particles in the same grid are stored successively. At this time, cellStart and cellEnd of each grid are calculated.

At step 406, the collision list for all the current particles are calculated based on the particle information, and cellStart and cellEnd. The calculation includes: for any of the particles, particle i, retrieving its coordinates from texture memory, calculating the serial number of the grid where the particle i is located, and scanning all the other particles in a total number 27 of grids including the current grid and the surrounding grids; if a distance between the centroid of any of the other particles and the centroid of the particle i is less than a sum of the radiuses of the two particles, labeling the particle i as a collision list CollideList[i][CollideListCnt[i]], and incrementing the number of collision lists as CollideListCnt[i]+1.

The tangential relative displacement occurs only when two particles collide. The tangential relative displacement at the previous moment is required to calculate the force applied to any particle i at the current moment. The data array U for storing the tangential relative displacement has the same dimensions as that of CollideList. U[i][j] stores a tangential relative displacement between the particle i and the particle CollideList[i][j]. To guarantee a correct calculation, it is necessary to re-sort the data array U based on the CollideList of the current moment, and CollideList and UOld of the previous moment before the calculation of the force applied to the particle at the current moment. This sorting process is implemented in GPU. Specifically, the data array U of the current moment may be obtained by sorting the UOld by using, as inputs, the collision list of the previous moment CollideListOld, CollideListCnt, UOld corresponding to CollideListOld, and the collision list of the current moment CoolideList[CollideListCnt].

Then, all the data arrays required for correctly calculating the force have been obtained. The force applied to each particle may be calculated according to the HM contact mechanics model at step 407. Specifically, the acceleration a and angular acceleration beta of each particle may be calculated according to the HM contact mechanics formula by using the coordinates pos, the velocity vel, the angular velocity w, the tangential relative displacement U of the particle, and the collision list CoolideList[CollideListCnt].

At step 408, updating by ½ step is performed again based on the calculated new acceleration a (angular acceleration beta).

Till now, the whole computation of one step in the computation module has been completed.

The data arrays of physical information of all the current particles are saved for preparation of subsequent data arrays. At step 409, a copying or pointer exchange technique may be used. The pointer exchange technique can exchange the start addresses between a current data array and a subsequent data array to be calculated. This can reduce time required for data copying.

It is determined whether to store externally at step 410. If external storage is required, all the physical information of all the particles is stored into an external storage device at step 411, in view of the risk that re-calculation of the information has to be performed due to power off. It is determined whether to perform a statistical operation at step 412. If a statistical operation is required, relevant statistical physical quantities, such as mean, variance and the like, are calculated at step 413. It is determined at step 414 whether a condition is met to end the computation process, for example, whether a predetermined times of computations have been performed. If the computation process is not completed, the process returns to step 402. Otherwise, the process ends, the results are saved, and the storage space is released.

Compared with an implementation of the international renowned software lammps (which is an widely-used open-source software, see http://lammps.sandia.gov/) based on CPU of eight cores, the computation speed of the simulation method of the present invention based on GPU (e.g., Telsa M2090) is increased by 10 times.

Various modifications and variants can be made to the present invention by those skilled in the art without departing from the spirit and scope of the present invention. Therefore, these modifications and variants are to be encompassed by the present invention if they fall within the scope of the present invention as defined by the claims and their equivalents.

What is claimed is:

1. A GPU-based particle flow simulation method for performing particle flow simulation by executing Discrete Element Method (DEM) in a plurality of parallel GPU, the method comprises:
   a. modeling the particles with the DEM method, assigning the DEM model as a plurality of particles, and allocating the plurality of particles to a plurality of computation nodes for processing, wherein CPU and GPU of each computation node are each allocated with memory space, data are initialized in the CPU and copied from the memory space of the CPU to the memory space of the GPU;
   b. processing the particles in the GPU of each computation node, wherein each stream processor of the GPU of each computation node processes one particle and updates coordinates of the particle in the memory space of the GPU and particle velocity;
   c. during the processing of step b, determining the particles controlled by each computation node, copying the number of the particles controlled by each computation node to the memory space of the CPU, dividing dynamically the particles according to the number of the particles in the memory space of the GPU, and determining dynamically which particles are to be processed by each computation node according to load balancing principle;
   d. causing the dynamically-divided particles to migrate between the computation nodes with MPI (Message Passing Interface) protocol;
   e. computing overlap areas in the GPU according to the particles to be processed by each computation node as determined in step c, copying data to the memory of the CPU, and performing data exchange with the MPI protocol;
   f. computing, by each stream processor of the GPU of each computation node, a serial number of a grid in the memory space of the GPU in which each particle lies according to the coordinates of the particle;
   g. computing, by each stream processor of the GPU of each computation node, a force applied to each particle and acceleration during the particle's movement;
   h. computing, by each stream processor of the GPU of each computation node, a velocity of each particle;
   i. returning to step b until a specified number of steps are performed;
   j. releasing the memory spaces of the master node and the computation nodes.

2. The method of claim 1, wherein, in the steps b, f, g and h, the GPUs perform data processing on the particles in parallel.

3. The method of claim 1, wherein said migrating the particles between the nodes in step d comprises transmitting and receiving respective physical quantities of particles between the nodes using MPI transmitting and receiving functions.

4. The method of claim 1, wherein said computing the overlap areas in the GPU in step e comprises using the GPU to compute the overlap areas, in which each stream processor of the GPU processes one grid;
   in the case of three dimensions, each grid has 26 neighboring grids; and step e comprises determining whether a neighboring grid is within a current computation node, if it is not, considering the neighboring grid as an overlap area, and obtaining it through migration from another node.

5. A GPU-based particle flow simulation method, comprising:
a modeling step of determining particle material, particle parameter, boundary condition, geometrical shape, and initial particle distribution area, and generating particles according to predetermined particle distribution area and number;
a task managing step of determining an optimal number of GPUs according to the number of particles and a number of idle GPUs in a plurality of computation nodes, determining GPUs to be used based on the optimal number of GPUs and the number of current idle GPUs, and setting a state of the GPUs to be used to non-idle; and
a computing step comprising
initializing the GPUs to be used in each of the computation nodes, and transmitting to each GPU particle information required for computation;
the respective GPUs updating predetermined velocities in parallel, and each GPU sorting the received particle information to generate its sorted cell list;
the respective GPUs computing in parallel non-zero serial numbers of grids in their current processes and a number of particles in the grids, and transmitting the computed serial numbers of grids and the number of particles to a master node among the plurality of computation nodes; the master node dividing the grids dynamically based on the optimal number of particles for each GPU, and determining a number of grids and their serial numbers to be computed in parallel in each GPU;
the respective GPUs transmitting and receiving particle information in parallel according to the determination result of the master node, and regenerating a respective sorted cell list in each GPU;
generating a collision list at a current moment in each GPU;
the respective GPUs adjusting in parallel locations for tangential relative displacement to conform to the collision list at the current moment, based on the collision list at the current moment, and a collision list and a tangential relative displacement at a previous moment;
the respective GPUs computing in parallel a force applied to each particle and acceleration according to HM (Hertz-Mindlin) contact mechanics model;
storing a current computation result;
returning to the updating the predetermined velocities by the respective GPUs in parallel if computation is not completed, otherwise ending the computation.

6. The method of claim 5, further comprising a presentation step of determining the boundary condition and drawing the geometrical boundary in the form of a transparent curved surface, drawing the particles as globules of identical or different colors according to particle location and diameter, displaying a scalar field in a grayscale image, and drawing a vector field with a streamline drawing method by weighted-mapping the particle information to the grids.

7. The method of claim 5, further comprising saving the physical information of all the particles into an external storage.

8. The method of claim 5, wherein the respective GPUs compute relevant physical statistical quantities in parallel.

9. The method of claim 5, wherein said generating particles according to predetermined particle distribution area and number comprises: generating several particles in a small space, and filling these particles into other spaces by translating and duplicating until the number of the particles meets requirement.

10. The method of claim 5, wherein in the sorted cell list, all the particles are sorted according to the grids in which the particles lie.

11. The method of claim 5, wherein the GPUs computes in parallel non-zero serial numbers of grids and the number of particles in the grids by using a dynamic dividing method.

12. The method of claim 5, wherein in each GPU, the computation is performed in a manner of one thread corresponding to one particle.

13. The method of claim 5, wherein said computing the tangential relative displacement comprises: recording the tangential relative displacement at a previous moment, and updating the tangential relative displacement based on the collision list at the current moment.

14. The method of claim 5, wherein the current computation result is stored in a data array through a copying or pointer exchanging technique.

15. A GPU-based particle flow simulation system, comprising:
a front-end server configured to generate particle information based on particle modeling information inputted from a client terminal, and generate geometric solid information;
a management node configured to receive the particle information and the geometric solid information from the front-end server, determine which GPUs of which computation nodes are to be used based on the number of the particles and the number of idle GPUs in each of the computation nodes, determine which particles are to be processed in which GPUs of which computation nodes based on the determined number of GPUs and a space distribution of the particles, and perform allocation according to the determination result;
a plurality of computation nodes each including a plurality of GPUs and configured to stimulate particle flow by computing in parallel in the plurality of GPUs a force applied to each particle due to particle collision and thus an acceleration;
a back-end server configured to present a stimulation result,
wherein
the front-end server includes a modeling module configured to determine particle material, particle parameter, boundary condition, geometrical shape and initial particle distribution area, and generate particles according to predetermined particle distribution area and number,
the management node includes a task managing module configured to determine an optimal number of GPUs according to the number of particles and a number of idle GPUs in a plurality of computation nodes, determine GPUs to be used based on the optimal number of GPUs and the number of current idle GPUs, and set a state of the GPUs to be used to non-idle; and
the plurality of computation nodes are further configured to
initialize the GPUs to be used in each of the computation nodes, and transmit to each GPU particle information required for computation;
update, by the respective GPUs, predetermined velocities in parallel, and sort the received particle information to generate its sorted cell list;
compute in parallel, by the respective GPUs, non-zero serial numbers of grids in their current processes and a number of particles in the grids, and transmit the computed serial numbers of grids and the number of particles to a master node among the plurality of computation nodes; the master node dividing the grids dynamically based on the optimal number of particles for each GPU, and determining a number of grids and their serial numbers to be computed in parallel in each GPU;

transmit and receive, by the respective GPUs, particle information in parallel according to the determination result of the master node, and regenerate a respective sorted cell list in each GPU;

generate a collision list at a current moment in each GPI;

adjust in parallel, by the respective GPUs, locations for tangential relative displacement to conform to the collision list at the current moment, based on the collision list at the current moment, and a collision list and a tangential relative displacement at a previous moment;

compute in parallel, by the respective GPUs, a force applied to each particle and acceleration according to (Hertz-Mindlin) contact mechanics model;

store a current computation result; and return to the updating of the predetermined velocities by the respective CPUs in parallel if computation is not completed, otherwise end the computation.

16. The system of claim 15, wherein the front-end server is configured to generate the geometric solid information by decomposing the geometric solid into a finite number of curved surfaces and numbering these surfaces.

17. The system of claim 15, wherein the back-end server is configured to present the stimulation result by drawing the geometrical boundary in the form of a transparent curved surface, drawing the particles as globules of identical or different colors according to particle location and diameter, displaying a scalar field in a grayscale image, and drawing a vector field with a streamline drawing method by weighted-mapping the particle information to the grids.

18. The system of claim 15, wherein the front-end server, the management node, the computation nodes and the back-end server communicate with each other via an IB (Infini-Band) network.

* * * * *